United States Patent [19]
Sturrock et al.

[11] Patent Number: 5,786,601
[45] Date of Patent: Jul. 28, 1998

[54] ELECTRON BEAM LITHOGRAPHY MACHINE

[75] Inventors: John Monro Sturrock, Cambridgeshire; Andrew Dean, Essex, both of United Kingdom

[73] Assignee: Leica Lithography Systems Ltd., Cambridge, United Kingdom

[21] Appl. No.: 750,850
[22] PCT Filed: Jun. 28, 1994
[86] PCT No.: PCT/EP94/02095
 § 371 Date: Jan. 24, 1997
 § 102(e) Date: Jan. 24, 1997
[87] PCT Pub. No.: WO96/00978
 PCT Pub. Date: Jan. 11, 1996
[51] Int. Cl.$^6$ ................................................. G01B 9/02
[52] U.S. Cl. .......................... 250/491.1; 250/442.11; 250/442.2
[58] Field of Search ........................ 250/491.1, 442.2, 250/442.11, 440.11

[56] References Cited
U.S. PATENT DOCUMENTS 5,644,137  7/1997  Waggener et al. ............... 250/491.1

Primary Examiner—Kiet T. Nguyen
Attorney, Agent, or Firm—Foley & Lardner

[57] ABSTRACT

An electron beam lithography machine comprises a movable support for a substrate, an electron beam column for providing an electron beam to scan the substrate, an optoelectronic monitoring system for monitoring the position of the substrate relative to the column axis, and a rigid mounting body for mounting the support and the column. Laser interferometers of the monitoring system are mounted in mutually fixed relationship on a rigid carriage which is supported relative to the body by rollable members. The rollable members rotatably bear against the walls of grooves in the body and in the carriage in such a manner that the carriage is secured against tilt relative to the body and limited deformation of the body, especially thermally induced expansion and contraction, is accommodated without alteration in the position of the interferometers relative to the axis.

23 Claims, 2 Drawing Sheets

ELECTRON BEAM LITHOGRAPHY MACHINE

BACKGROUND OF THE INVENTION

1. Field of the Invention.

The present invention relates to an electron beam lithography machine and has particular reference to the mounting of components of a monitoring system in such a machine.

2. Description of the Prior Art.

In electron beam lithography a vertically directed electron beam is required to intersect a horizontal substrate, on which a pattern such as an integrated circuit is to be written, with a high degree of accuracy. The pattern is conventionally fractured into fields and the fields into subfields, with the latter written by controlled deflection of the beam and the former by movement of the substrate to position each field in turn in a zone swept by the deflected beam. In order to ensure precise positioning of the substrate, its movement in X and Y axial directions in a horizontal plane must be accurately monitored. Present standards of accuracy, achieved by laser interferometry measurement systems, are in the order of 50 nanometres. In such systems a divided laser beam is aimed at orthogonal mirrors associated with a movable stage carrying the substrate and measurements of the stage movement are derived from the interference of the outward and return beams. The measurement accuracy of this system can be influenced to a substantial degree by undesired movement of the interferometers relative to each other and to the neutral axis of the beam. Movements of this nature can arise due to, in particular, atmospheric pressure changes and temperature changes. The former occur because the electron beam, and thus also the mounting locations of the interferometers, must be situated in a region of high vacuum. The vacuum vessel required for this purpose will deflect under change in external atmospheric loading and will also expand or contract with temperature change. These movements are transmitted directly to the interferometers if mounted on the vessel.

Various methods have been adopted to ensure that the interferometer positions are as stable as possible. Vacuum vessels have been made with massive, reinforced constructions to minimise deflection due to pressure change and of materials which have a low coefficient of expansion so as to reduce susceptibility to thermally-induced deformation. The vessels themselves have been designed to be small, in order to keep mass within limits and to enhance rigidity, and the machines have been operated in temperature-controlled environments to eliminate change in ambient temperature. These solutions are all subject to compromise in one form or another. Construction of massive pressure vessels from relatively expensive low-expansion material adds to the overall cost of the machine and temperature control of the environment, which itself contributes to operating costs, has little effect on heat radiation from sources within the machine.

Another approach is construction of the vacuum vessel to be deformable under load and to mount the position-sensitive components of the machine, that is to say electron beam column, substrate stage and interferometer heads, on a single rigid body. A machine of that kind is disclosed in United Kingdom patent specification No 1 578 538. This machine is characterised by a massive ring which supports the column, inclusive of electron-optical components for beam focussing and correction, and from which depends a rigid structure carrying the substrate stage. The interferometer heads are mounted on the underside of the ring or on side members of the depending structure. The vacuum vessel encloses the body consisting of ring and depending structure and is connected to the body at a relatively small contact area at the top of the ring.

The arrangement described in No 1 578 538 has proved successful in uniting the column, stage and interferometers into a rigid sub-assembly largely resistant to relative displacements of these components due to atmospheric change. There still remains scope, however, for further reduction in the susceptibility to displacement of the critical position monitoring system components due to pressure and temperature change, so that even higher degrees of measurement accuracy can be achieved.

SUMMARY OF THE INVENTION

It is therefore the principal object of the invention to improve the mounting arrangement for monitoring system components in an electron beam lithography machine so as to achieve greater stability of the positional relationship of the components to each other and to the beam axis.

Other objects and advantages of the invention will be apparent from the following description.

According to the present invention there is provided an electron beam lithography machine comprising a movable support for a substrate, an electron beam column for providing an electron beam to scan the substrate, a contactless position monitoring system for monitoring the position of the substrate relative to the optical axis of the column, and a rigid mounting body mounting the support means and the column, characterised in that components of the monitoring system are mounted in mutually fixed relationship on a rigid carriage which is supported relative to the body at a plurality of contact points provided by rollable members, the rollable members being arranged to secure the carriage against tilt relative to the body and to permit limited deformation of the body substantially without influence on the position of the components relative to the axis.

The rollable members preferably act between the body and the top and the bottom of the carriage. For preference, at least some of the rollable members are balls rotatably guided in grooves in both the body and the carriage, the grooves being arranged as to permit relative displacement of the body and the carriage in and only in directions substantially radial to the column axis. Limitation of the relative displacement to radial directions can be achieved in simple manner by radial orientation of the grooves and by ensuring that such ball and groove combinations are present at a minimum of three angularly spaced positions. The balls and grooves at those three positions then interact to, in effect, preclude any relative horizontal displacement of the body and carriage apart from radial displacement arising from expansion or contraction of the body. It is preferable, however, if all of the rollable members at the top or at the bottom of the carriage are balls guided in grooves. This provides particularly positive location of the carriage, but it remains possible for, for example, the rollable members at the top or at the bottom of the carriage to be non-guided balls or rollers bearing against flat or other suitable surfaces. In a preferred arrangement, the rollable members at the top of the carriage are guided in grooves in both the body and the carriage, while those at the bottom of the carriage are guided in grooves only in the carriage.

When grooves are present at both the top and bottom of the carriage, they can be conveniently provided at the ends of inserts in the carriage. Similarly, when grooves are present in the body above the carriage, they can be provided at lower ends of inserts in the body.

The grooves are, for ease of production, preferably of substantially V-shaped cross-section, in which case the associated balls each have wall surface contact at two points in each groove. Other groove configurations allowing rolling contact are possible, however, such as concave cross-sections with a radius of curvature greater than the ball radius.

An optimum security of the carriage against tilt relative to the body, in conjunction with a minimum number of support points, may be achieved if the rollable members are disposed at three spaced-apart locations around the periphery of the carriage. In that case a respective one of the components of the monitoring system can be arranged at each of two of the locations, those two locations having a pitch spacing of 90° with respect to the column axis so that the components are appropriately positioned for monitoring mutually perpendicular movements of the stage. The carriage itself can comprise an annular member with a respective radially outwardly projecting arm at each of the two locations.

In one preferred construction, the mounting body comprises a plate carrying the column and the carriage is engaged in a recess at the underside of the plate. The rollable members can then act between the base of the recess and the top of the carriage and between the bottom of the carriage and the tops of projections at the plate. The projections are preferably tongues which are secured to the plate and engage in depressions at the underside of the plate. This avoids interference by the tongues with the attachment to the underside of the plate, at its periphery, of a depending carrier for the substrate support. The projections preferably function as leaf springs biassing the carriage towards the base of the recess, the leaf springs being able to flex to accommodate differential vertical expansion of the plate and carriage. The projections can also engage in depressions at the underside of the carriage.

The carriage itself preferably has an integral construction and is of a material having at most a low coefficient of expansion. The rollable members are, for preference, of a wear-resistant material, preferably with at most a medium thermal conductivity. These features largely remove any tendency of the carriage to thermally-induced deformation, particularly if the carriage is arranged in a vacuum chamber and thus largely isolated from the environment by the vacuum.

The monitoring system is preferably an optoelectronic measuring system, the carriage-mounted components of which are laser interferometers. However, the mounting arrangement is equally suitable for other forms of contactless monitoring systems.

BRIEF DESCRIPTION OF THE INVENTION

An embodiment of the invention will now be described in more detail with reference to the accompanying drawings, in which.

DETAIL DESCRIPTION OF THE PREFERRED EMBODIMENT

Figure 1:
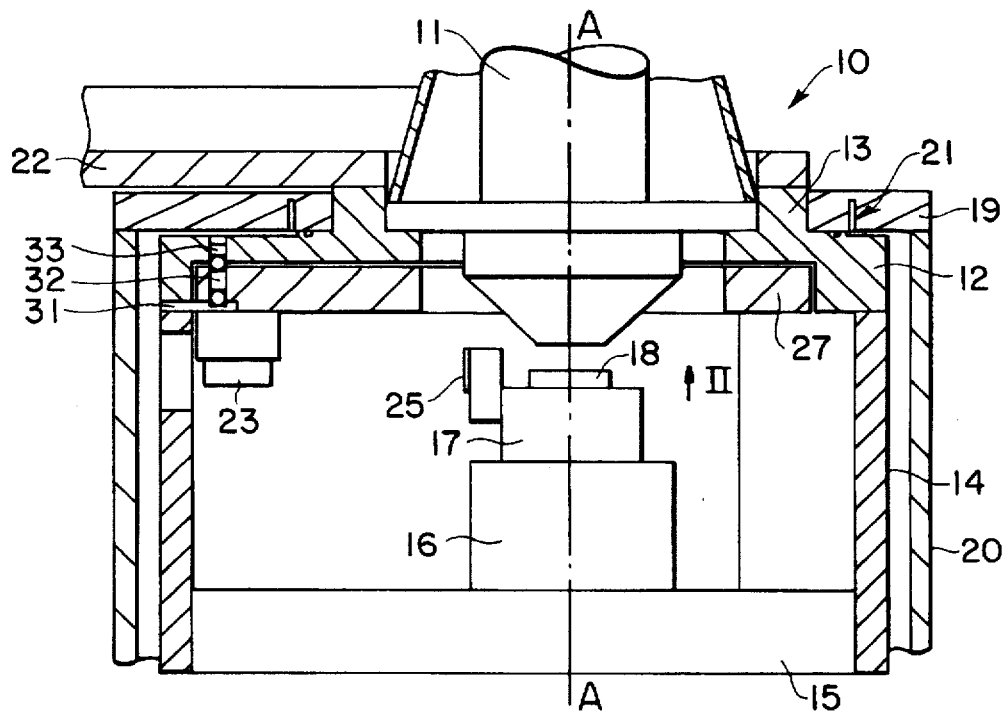
FIG. 1 is a schematic sectional elevation of part of an electron beam lithography machine embodying the invention, showing a mounting arrangement for two interferometers (only one shown) of a substrate position monitoring system.

Referring now to the drawings, there is shown part of an electron beam lithography machine 10 used for writing a pattern, for example an integrated circuit, on a substrate such as a mask plate or a wafer. The machine incorporates an electron beam optical column 11, of which only the lower end portion is shown in FIG. 1, for generating a focussed electron beam. The lower end of the column terminates in a final lens assembly and deflection coils which are digitally controlled, by way of software responsive to pattern data, to deflect the beam with respect to the optical axis A—A of the column, which also represents the neutral axis of the beam. The beam deflection provides fine scanning of individual parts of the pattern to be written.

Figure 2:
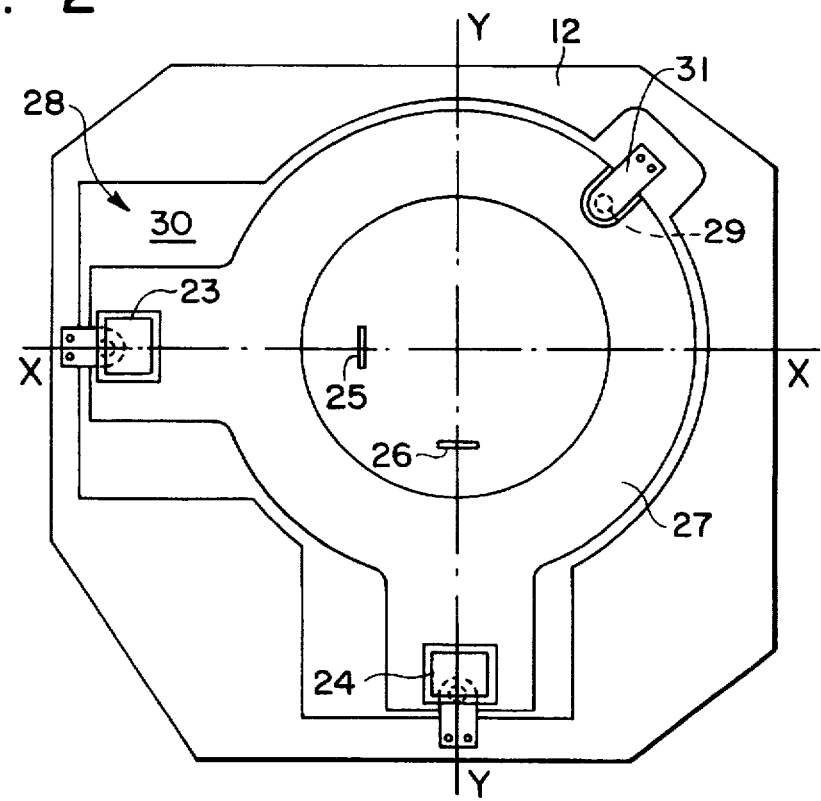
FIG. 2 is a schematic view from below, thus in the direction of arrow II in FIG. 1, of the mounting arrangement.

The column 11 is mounted on a unitary steel plate 12, which is of relatively massive construction to optimise rigidity. As illustrated in FIG. 2, the profile of the plate is approximately rectangular with angled corners. The plate has an aperture through which the final lens assembly of the column 11 projects and, at its upper side, a circular collar 13 surrounding a seat for the column.

Depending from the plate 12 is a carrier carrying a movable support for the substrate. The carrier consists of four spaced-apart struts 14 (only two of which are shown in FIG. 1) rigidly connected to the underside of the plate 12 at its periphery, and a base member 15 secured to the lower ends of the struts. The substrate support, which is represented only diagramatically, principally consists of a movable stage 16 arranged on the base member 15, a chuck holder 17 mounted on the stage and a substrate chuck 18 removably located on the holder. The stage 16, together with the chuck holder 17, chuck 18 and any substrate in the chuck, is displaceable along axes X—X and Y—Y (FIG. 2) of a plane Cartesian co-ordinate system by appropriate drives (not shown) for the purpose of movement of different sections of the substrate into the region of the beam, i.e. zone of beam deflection, for pattern scanning. The chuck 18, after completion of pattern writing on the substrate, can be exchanged against another chuck with a fresh substrate.

The plate 12 and the depending carrier together form a rigid body mounting the beam column and substrate support.

This mounting body is enclosed, with the exception of part of the collar 13, by a vacuum vessel consisting of a lid 19 and a casing 20, which is shown only in part. The vessel casing includes a lateral opening through which exchange of substrate chucks can be carried out by a chuck exchange mechanism (not shown). The interior of the vessel forms a vacuum chamber which can be evacuated to enable the electron beam to be established. To minimise transmission to the mounting body of the deflections arising in the vessel structure on evacuation and relief of the chamber, the lid 19 is mounted on the plate 12 at a narrow step adjoining the collar 13 and has an annular weakening slot 21 outwardly of the step, so that limited flexure of the lid is possible. A further such annular slot (not shown) can be provided in the vicinity of the casing 20.

In order to accurately monitor the position of the stage thereby to allow its movement to be controlled with the degree of precision required, the machine is equipped with an optoelectronic position monitoring system operating on the basis of laser interferometry. The system comprises a laser gun (not shown) which is carried by a cantilever arm 22 mounted on the collar 13, thus on the mounting body for the column and substrate support. The beam emitted by the gun is transmitted along a direct first path and along an optically deflected second path split off the direct path to two mutually orthogonal interferometers 23 and 24 for onward transmission to and reflection back from respectively associated mirrors 25 and 26 at the holder 17. The beam interference produced in each interferometer is evaluated by an associated electronic circuit to derive a measure of the stage movement in the respective axial direction. The interferometer 23 additionally transmits a reference beam to a point on the mirror 25 displaced from the point of incidence of the first-mentioned, or measurement, beam. Signals derived from the reference beam and measurement beam are compared to determine any yaw in the stage movement, so that necessary corrections can be calculated.

Notwithstanding the minimal mechanical connection of the mounting body to the lid of the vacuum vessel and the overall rigidity of the body, slight deformation of the body can still occur under atmospheric load change acting on the vacuum chamber. The body is also susceptible to thermally induced expansion and contraction. Movements of these kinds, if transmitted to the interferometers, could lead to change in their relative position and in their spacing from the axis A—A. Such changes would introduce error into the critical stage movement measurement. To avoid or minimise this possibility, the interferometers are mounted in such a manner that their relationship is fixed and so that they are largely mechanically separated and thermally insulated from other parts of the machine. For this purpose the interferometers are attached to the underside of a rigid carriage 27 of material having a low, or possibly even zero, coefficient of expansion, for example 'Invar' or 'Zerodur'. As shown in FIG. 2, the carriage 27 has the form of an annular member provided at its periphery with two mutually perpendicular and radially outwardly extending arms, each serving as a mount for a respective one of the interferometers 23 and 24. The interferometers are adjusted so that their optical axes lie in the same plane as the surface to be written, include an angle of exactly 90° and intersect at the axis A—A.

The carriage 27 itself is accommodated in a recess 28 machined into the plate 12 at its underside, the underside of the plate being approximately coplanar with the underside of the carriage. As apparent from FIG. 2, the plan profile of the recess generally conforms with that of the carriage, but with varying degrees of clearance spacing in relation to the carriage. The carriage 27, together with the interferometers 23 and 24, is supported relative to the mounting body for the column 11 and substrate support 16 to 18 at three locations by way of twenty-one point contacts provided by six rotatable balls of a wear-resistant material, for example tungsten carbide, ceramic or synthetic sapphire. Three of the balls are arranged at the top of the carriage and the other three at corresponding positions at the bottom of the carriage. The three support locations are spaced apart around the periphery of the carriage; in particular, two are disposed at the radially outwardly directed arms mounting the interferometers and one at an angular position equidistant from the arms on a radius opposite the bisector of the angle included by the arms. This number and disposition of the support locations ensures that the carriage can bear against the plate 12 completely free of any possibility of tilting or rocking.

Figure 3:
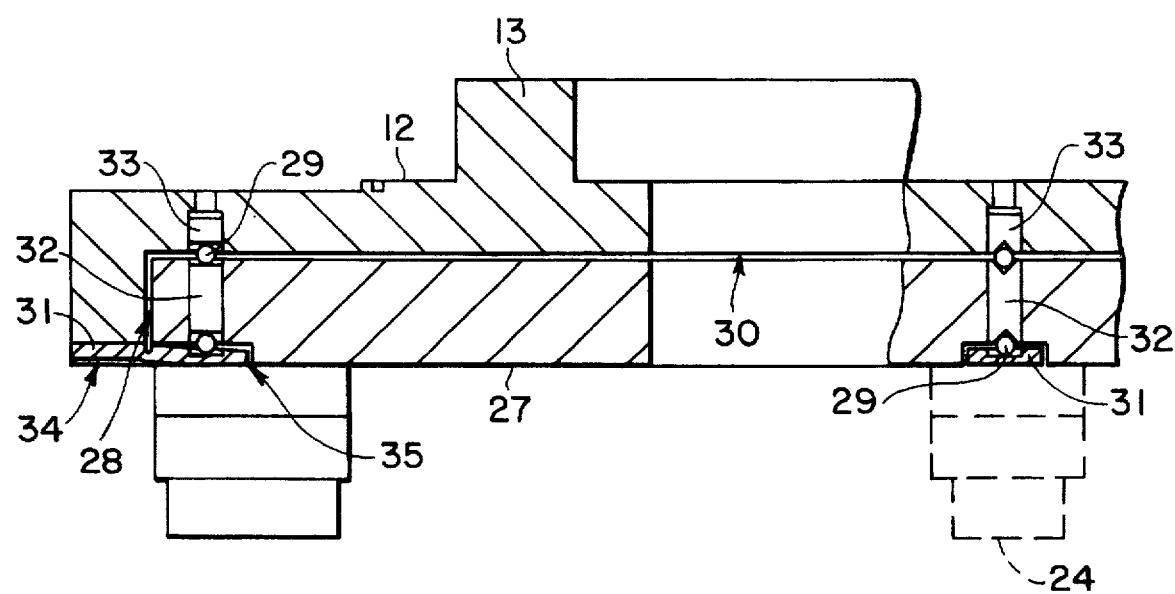
FIG. 3 is a schematic sectional elevation, to an enlarged scale, showing part of the mounting arrangement in more detail.

As evident from FIG. 3, the upper support balls 29 bear against the walls of V-shaped grooves at the base 30 of the recess 28 and at the top of the carriage, while the lower support balls 29 bear against the walls of further V-shaped grooves at the bottom of the carriage and the planar bases of transverse slots at the tops of tongues 31 which are secured to the underside of the plate 12 and project radially inwardly with respect to the axis A—A. The V-shaped grooves at the top and bottom of the carriage are formed in the ends of plungers 32 located in bores in the carriage. The grooves at the base 30 of the recess 28 are similarly formed at the lower ends of plungers 33 located in bores in the plate 12. The transverse slots in the tongues 31 are machined directly into the tongues. All of the V-shaped grooves extend radially with respect to the axis A—A.

Each of the tongues 31 is engaged in a respective depression 34 at the underside of the plate 12 and in a further respective depression 35 at the underside of the carriage 27. The tongues 31 are beryllium copper strips provided with further, and deeper slots, which allow the tongues to function as leaf springs with limited deflection under differential thermal expansion of the plate and carriage.

The walls of the V-shaped grooves with which the balls 29 have rolling point contact constitute radial tracks permitting relative displacement of the plate 12 and carriage 27 exclusively in directions radial to the axis A—A. Such relative displacement may arise in the event of expansion or contraction of the plate 12 due to change in ambient temperature or heat conduction or radiation from components within the electron beam column 11. The carriage, with low or zero coefficient of expansion, is largely free from deformation of that kind and the rolling support relative to the plate prevents movements of the plate from being transmitted to the carriage and ultimately to the interferometers. The provision of rolling, rather than sliding, contact minimises friction and stick/slip phenomena between the plate and carriage. Moreover, the balls serve as thermal insulators separating the carriage from the plate and tongues apart from the twenty-one point contacts, so that the carriage is effectively isolated in the high vacuum created in the vacuum chamber. This isolation of the carriage from thermal influence is such that it is sufficient for the carriage to consist of material with a low, rather than a zero, coefficient of expansion.

As a result of this mounting arrangement of the interferometers, the carriage and thus the interferometers should remain in a substantially fixed position with respect to the optical axis A—A of the column during operation of the machine. Measuring accuracy is therefore improved and less stringent conditions are necessary in respect of controlling temperature, countering the effects of barometric pressure change and maintaining fine mechanical tolerances.

We claim:

1. An electron beam lithography machine comprising a movable support for a substrate, an electron beam column for providing an electron beam to scan the substrate, a contactless position monitoring system for monitoring the position of the substrate relative to the optical axis of the column, and a rigid mounting body mounting the support and the column, characterised in that components of the monitoring system are mounted in mutually fixed relationship on a rigid carriage which is supported relative to the body at a plurality of contact points provided by rollable members, the rollable members being arranged to secure the carriage against tilt relative to the body and to permit limited deformation of the body substantially without influence on the position of the components relative to the axis.

2. A machine according to claim 1, wherein the rollable members act between the body and the top and the bottom of the carriage.

3. A machine according to claim 2, wherein at least some of the rollable members are balls rotatably guided in grooves in both the body and the carriage, the grooves being so arranged as to permit relative displacement of the body and the carriage in and only in directions substantially radial to the column axis.

4. A machine according to claim 3, wherein the grooves are present at both the top and the bottom of the carriage and are provided at the ends of inserts in the carriage.

5. A machine according to claim 3, wherein the grooves are present in the body above the carriage and are provided at lower ends of inserts in the body.

6. A machine according to claim 3, wherein the grooves are of substantially V-shaped cross-section.

7. A machine according to claim 1, wherein the rollable members are disposed at three spaced-apart locations around the periphery of the carriage.

8. A machine according to claim 7, wherein a respective one of the components of the monitoring system is arranged at each of two of the locations, said two locations having a pitch spacing of 90° with respect to the column axis.

9. A machine according to claim 8, wherein the carriage comprises an annular member with a respective radially outwardly projecting arm at each of said two locations.

10. A machine according to claim 1, wherein the body comprises a plate carrying the column and the carriage is engaged in a recess at the underside of the plate.

11. A machine according to claim 10, wherein the rollable members act between the base of the recess and the top of the carriage and between the bottom of the carriage and the tops of projections at the plate.

12. A machine according to claim 11, wherein the projections are tongues secured to the plate.

13. A machine according to claim 12, wherein the tongues engage in depressions at the underside of the plate.

14. A machine according to claim 11, wherein the projections function as leaf springs biassing the carriage towards the base of the recess.

15. A machine according to claim 11, wherein the projections engage in depressions at the underside of the carriage.

16. A machine according to claim 1, wherein the carriage is of integral construction.

17. A machine according to claim 1, wherein the carriage is of a material having at most a low coefficient of expansion.

18. A machine according to claim 1, wherein the rollable members are of a wear-resistant material.

19. A machine according to claim 18, wherein the material of the rollable members is tungsten carbide.

20. A machine according to claim 1, wherein the carriage is arranged in a vacuum chamber.

21. A machine according to claim 20, wherein the vacuum chamber is defined by a vacuum vessel connected to and substantially entirely enclosing the mounting body.

22. A machine according to claim 1, wherein the monitoring system is an optoelectronic measuring system.

23. A machine according to claim 22, wherein the monitoring system components are laser interferometers.

* * * * *